United States Patent [19]
Butler et al.

[11] Patent Number: 5,821,598
[45] Date of Patent: Oct. 13, 1998

[54] UNCOOLED AMORPHOUS YBACUO THIN FILM INFRARED DETECTOR

[75] Inventors: Donald P. Butler; Zeynep Celik-Butler, both of Dallas, Tex.; Pao-Chuan Shan, Nantou, Taiwan; Agha Jahanzeb, Dallas, Tex.

[73] Assignee: Research Corporation Technologies, Inc., Tucson, Ariz.

[21] Appl. No.: 667,628

[22] Filed: Jun. 21, 1996

Related U.S. Application Data

[63] Continuation-in-part of Ser. No. 382,200, Feb. 1, 1995, Pat. No. 5,572,060.

[60] Provisional application No. 60/000,424, Jun. 22, 1995.

[51] Int. Cl.⁶ .......................... H01L 31/058; H01L 29/04; H01L 31/036; H01L 31/0376
[52] U.S. Cl. .............................. 257/467; 257/43; 257/53; 257/613
[58] Field of Search ................................ 257/43, 53, 467, 257/613

[56] References Cited

U.S. PATENT DOCUMENTS

| | | |
|---|---|---|
| 3,881,181 | 4/1975 | Khajezadeh . |
| 4,544,441 | 10/1985 | Hartmann et al. ........................ 156/634 |
| 5,572,060 | 11/1996 | Butler et al. ............................. 257/467 |

*Primary Examiner*—Ngân V. Ngô
*Attorney, Agent, or Firm*—Oblon, Spivak, McClelland, Maier & Neustadt, P.C.

[57] ABSTRACT

A thermal detector includes a transducer layer of semiconducting yttrium barium copper oxide which is sensitive at room temperature to radiation and provides detection of infrared radiation. In a gate-insulated transistor embodiment, a layer of ferroelectric semiconducting yttrium barium copper oxide forms a gate insulator layer and increases capacitance of the transistor or latches the transistor according to the polarization direction of the ferroelectric layer. The transducer layer may be formed as an amorphous semiconductor and deposited at room temperature by simple sputtering. The sensitive element can be incorporated into a thermal isolation structure as part of an integrated circuit.

10 Claims, 14 Drawing Sheets

UNCOOLED AMORPHOUS YBACUO THIN FILM INFRARED DETECTOR

REFERENCES TO RELATED APPLICATIONS

This application claims the benefit of U.S. provisional application 60/000,424 filed Jun. 22, 1995. This application is also a continuation in part of U.S. application Ser. No. 08/382,200 filed Feb. 1, 1995, now U.S. Pat. No. 5,572,060.

The invention disclosed herein was made with the support of NSF Grant ECS-9421969 and Army Research Office Grant 33848PH.

BACKGROUND OF THE INVENTION

1. Field of the Invention

This invention relates generally to infrared detectors and more specifically to thin film amorphous infrared detectors that operate at room temperature.

2. Description of the Background

A radiation detector is a device that produces an output signal which is a function of the amount of radiation that is incident upon an active region of the detector. Infrared detectors are those detectors which are sensitive to radiation in the infrared region of the electromagnetic spectrum. Infrared detectors include two types of detectors, thermal detectors and photon detectors.

Photon detectors function based upon the number of photons that are incident upon a transducer region of the detector. Photon detectors have a direct interaction between electrons and photons, are relatively sensitive and have a high response speed compared to thermal detectors. However, photon detectors operate well only at low temperatures and therefore require refrigeration to provide sensitive detection.

Thermal detectors function based upon a change in the temperature of the transducer region of the detector due to absorption of the radiation to be detected. Thermal detectors provide an output signal that is proportional to the temperature of the transducer region. Since radiation absorption usually occurs over a wide range of wavelengths, thermal detectors are typically responsive over a wide range of wavelengths. However, thermal detectors typically have a lower sensitivity and a slower response speed than photon detectors.

A bolometer is a thermal detector having a transducer region whose resistance depends upon its temperature. The voltage responsivity of a bolometer is a measure of the effectiveness of the bolometer at detecting radiation. The voltage responsivity of a bolometer is defined as follows:

$$R_{VB} = dR/dT \, \eta I_b/(G(1-\omega^2\tau^1)^{1/2})$$

where $I_b$ is bias current that is passed through the transducer region of the detector, R is electrical resistance of the transducer region of the detector, $\eta$ is absorptivity of electromagnetic radiation incident upon a surface of the transducer region of the detector, G is the coefficient of thermal conductance of heat away from the transducer region of the detector, $\omega$ is angular modulation frequency of electromagnetic radiation incident upon the transducer region of the detector, T is the temperature of the transducer region, and $\tau$ is the thermal time coefficient of the transducer region of the detector. $\tau$ is equal to C/G where C is the heat capacity of the transducer region of the detector.

Normalized voltage detectivity $D^*_{VB}$ for a bolometer is another measure of the sensitivity and is defined by $$D^*_{VB} = (R_{VP}(\Delta f \cdot A)^{1/2})/V_n$$

where $\Delta f$ is the frequency bandwidth (usually of an amplifier) associated with the bolometer and $V_n$ is the noise voltage of the output signal of the bolometer. High detectivity therefore requires (1) a low noise voltage $V_n$ and (2) a high responsivity $R_{VP}$.

Recently, microbolometer array structures have been fabricated for thermal imaging. The new generation bolometers are made from vanadium oxides, amorphous silicon and high $T_c$ superconductors. The first of these is a semiconductor including $V_2O_5$ and $VO_2$. Preparation of vanadium oxides in both bulk monocrystalline form and thin film form is very difficult given the narrowness of the stability range of the oxide. Both oxides show a temperature induced reversible crystallographic transformation from a semiconductor to a metal as the temperature is increased. This phase transition can be utilized to build optical switches where laser pulses induce heating. However, for infrared radiation detection applications, the highly absorbing and reflecting characteristics of the metal phase are undesirable.

As for amorphous silicon, although it shows a reasonable TCR (Temperature Coefficient of Resistance), and excellent compatibility with existing CMOS technology, it has been shown to exhibit a very large 1/f noise, and therefore low sensitivity.

A pyroelectric detector is a thermal detector incorporating a pyroelectric material as the transducer material. Pyroelectric materials have an electric polarization and thereby a dielectric constant which are functions of temperature. As the temperature of the pyroelectric material changes, the electric polarization of the pyroelectric material changes. Insulating pyroelectric materials generate a surface charge that is proportional to their electric polarization because of the pyroelectric effect. A pyroelectric detector may be formed from a capacitor which has a pyroelectric material as its dielectric.

The responsivity of a pyroelectric detector $R_{VP}$ is defined as the ratio between the output voltage of the pyroelectric detector and the radiant power that is incident upon the pyroelectric detector. The normalized voltage detectivity of pyroelectric detector $D^*_{VP}$ is defined as:

$$D^*_{VP} = (R_{VP}(\Delta f \cdot A)^{1/2})/Vn$$

where $R_{VP}$ is the voltage responsivity of the pyroelectric detector, $V_n$ is the noise voltage of the pyroelectric detector, $\Delta f$ is the frequency bandwidth (usually of an amplifier) that is associated with the pyroelectric detector, and A is the area of a surface of the pyroelectric material which is heated by the incident radiant power.

Another measure of the sensitivity of a pyroelectric detector is the pyroelectric figure of merit $M_r$ which is defined as follows:

$$M_r = p/(\rho c_p(\epsilon_r \text{Tan}(\delta))^{1/2})$$

where $c_p$ is the specific heat of the heated portion of the pyroelectric detector, $\rho$ is the density of heated portion of the pyroelectric detector, $\epsilon_r$ is the dielectric constant of the pyroelectric material (where $\epsilon = \epsilon_r \times \epsilon_0$ and $\epsilon_0$ is the permitivity of free space), and $\delta = (\sigma/(\omega \cdot \epsilon))^{1/2}$, where $\sigma$ is the conductivity of the pyroelectric material and $\omega$ is the angular frequency at which incident radiation falling upon the pyroelectric detector is modulated. The change in permitivity and electric polarization of a pyroelectric material or layer provide measures of the change in temperature of the pyroelectric material.

The change in electric polarization of a pyroelectric material provides a pyroelectric current which is defined as the change in surface charge on the surface of the pyroelectric material per unit time that is generated by the change in magnitude of the electric polarization of the pyroelectric layer.

The latest generation pyroelectric devices are thin films deposited on Si air-gap bridge structures for low-thermal mass, low thermal conductivity and hence increased responsivity. Since these devices are made on silicon, they can be directly integrated into silicon signal processing circuitry without the need for pump-bonds or wires.

Prior art thermal detectors (i.e., bolometers and pyroelectric detectors) have been characterized by a D* for infrared detection of less than $10^{10}$. There is a continuing need for higher sensitivity, lower noise, and therefore higher detectivity thermal detectors.

Many of the prior art infrared detector materials use a transducing material for which there is no suitable thin film deposition technology. For example, barium strontium titanate transducers, which have been used as pyroelectric transducers, have been prepared by first forming bulk ceramics and then mechanically thinning the bulk ceramics in order to reduce their heat capacity.

It is desirable to have a transducer material that is compatible with thin film deposition and processing technologies. In addition, it is desirable to have a transducer material which can be vacuum deposited as a thin layer or film (i.e., having a thickness of less than a few microns) without requiring significant heating of the substrate.

Another technology which is unrelated to sensors per se, but which is coincidentally addressed by the present invention, is gate-insulated transistor technology. Transistors operate by switching a semiconductor conductive channel between a conducting "open" state and a non-conducting "closed" state. Gate-insulated transistors use the voltage applied from a gate electrode to affect the potential of a conductive channel in the semiconductor. The potential applied to the conductive channel by the gate electrode determines whether charge carriers (i.e., electrons or holes) travel along the conductive channel when an electromotive force exists along the conductive channel. Thus, the voltage of the gate electrode determines whether the conductive channel is in the conducting "open" state or the nonconducting "closed" state.

Typically, the voltage applied to the gate electrode must be continuously maintained in order to maintain a potential at the conductive channel and the particular switching state of the transistor (i.e., either the "open" state or the "closed" state). An electrically insulating layer, called a gate insulator layer, separates the gate electrode from the conductive channel of the transistor.

When the gate insulating material includes a layer of ferroelectric material, the polarization of the ferroelectric layer affects the potential of the conductive channel. Therefore, it is possible to switch the conductive state of the channel of the transistor between the "open" state and the "closed" state, by inverting the polarization of the layer of ferroelectric material.

The polarization of the layer of ferroelectric material may be inverted by applying a voltage pulse of suitable polarity to the gate electrode to generate an electric field at the ferroelectric layer that will invert the polarization of the ferroelectric layer. When a voltage pulse is applied to the gate electrode which switches the ferroelectric state of the ferroelectric gate insulator, there is a change in the electric polarization of the ferroelectric gate. This electric polarization change results in a change in the potential of the conductive channel of the transistor.

Gate-insulated transistors including a ferroelectric insulator layer in the gate insulator are also desirable for memory cells. A ferroelectric layer in the gate insulator attracts or repels charge carriers in the conductive channel of the transistor thereby providing a mechanism to store charge. The capacity of charge storage of a gate-insulated transistor incorporating a ferroelectric insulator layer in the gate insulator is greater than the capacity of a gate-insulated transistor without a ferroelectric layer in the gate insulator.

However, the materials that are known to be ferroelectric and which can be deposited in a layer on conventional semiconductors such as silicon must be deposited at relatively high deposition temperatures. These high deposition temperatures are detrimental to the structures that are necessary to form devices in conventional semiconductor substrates, such as silicon substrates. Thus, there is a long felt need for a ferroelectric material which is compatible with conventional semiconductor processing technology so that it can be used as a ferroelectric layer in a gate insulator for silicon based transistors.

SUMMARY OF THE INVENTION

It is an object of the invention to provide a thermal detector with a high detectivity and that does not require cooling.

It is another object of the invention to provide a bolometer with a high detectivity and that does not require cooling.

It is another object of the invention to provide a pyroelectric detector with a high detectivity and that does not require cooling.

It is another object of the invention to provide a gate insulated transistor incorporating a ferroelectric layer in the gate insulator.

It is another object of the invention to provide a bolometer using an amorphous semiconducting YBaCuO thin film.

The present invention provides bolometers and pyroelectric detectors which can operate at room temperature with a transducer including a layer of material which has a resistivity at twenty degrees centigrade of at least 0.1 $\Omega$-cm, a temperature coefficient of resistance at twenty degrees centigrade of at least 0.4 percent per degree centigrade, a dielectric constant of at least 50, a change in dielectric constant with change in temperature of at least at least 0.20 per degree centigrade.

The present invention also provides a transistor having a gate insulator which includes a layer of material which is ferroelectric at room temperature and which can be deposited at temperatures that are compatible with conventional semiconductor processing.

The layers of materials provided by the present invention consist essentially of yttrium or any of the rare earths or lanthanum or combinations thereof, barium or strontium or calcium or combinations thereof, copper, and oxygen (yttrium or any of the rare earths or lanthanum or combinations thereof, barium or strontium or calcium or combinations thereof, copper, and oxygen are hereinafter referred to herein as "YBCO") in one or more solid state phases that are crystalline or polycrystalline, such that the layers exhibit semiconducting resistance versus temperature behavior, which means that the resistivity is relatively high compared to metals and compared to crystalline conducting orthorhombic $YBa_2Cu_3O_7$, and that the resistance of the layers increase with decreasing temperature. Since lanthanum and the rare earth elements substitute for Y in YBCO phases, lanthanum or any of the rare earth elements may partially or completely substitute for yttrium in the layers of YBCO.

These rare earth elements include Ce, Pr, Nd, Pm, Sm, Eu, Gd, Tb, Dy, Ho, Er, Tm, Yb, and Lu.

The resistivity at twenty degrees centigrade of the YBCO layers of the invention is greater than 0.1 Ω-cm and more preferably greater than 1.0 Ω-cm. The range of resistivity for the YBCO layers are at least 1.4 to 15 Ω-cm. The temperature coefficient of resistance (temperature coefficient of resistance means 1/R×dR/dT, R being resistance and T being temperature) of the YBCO layers of the invention at twenty degrees centigrade are greater than 0.4 percent per degree Centigrade, and preferably greater than 2.0 percent per degree Centigrade. The range of temperature coefficient of resistance values for the YBCO layers of the invention that have been measured is 0.4 to 4.02 percent. Improved materials processing will provide a YBCO layer with temperature coefficients of resistance in the range of five to ten percent at twenty degrees centigrade. The dielectric constant of the layers of materials of the invention at 20 degrees centigrade are greater than 50 and at least as high as 87. The change in dielectric constant with change in temperature at twenty degrees centigrade is greater than 0.2 and is preferably greater than 0.5.

The solid state phases in the YBCO layers of the invention include primarily the semiconducting phases in the YBCO phase diagram, specifically including the tetragonal phase of $Y_1Ba_2Cu_3O_{6+x}$ where $0 \leq X < 0.5$, crystalline phases having the compositions $Y_2BaCuO_{5+\delta}$ in which $-0.5 < \delta < 0.5$, and $YBa_3Cu_2O_x$, and amorphous semiconducting phases of YBCO.

Moreover, the YBCO layers of the invention may include, (although this is detrimental to the advantageous properties of the material), a small amount of metallic crystalline or polycrystalline solid state phases of YBCO. Metallic here means that the resistivity is less than about 0.05 Ω-cm at twenty degrees centigrade and decreases with decreasing temperature. The metallic phases in the YBCO phase diagram include $Y_1Ba_2Cu_3O_{7-x}$ where $0 \leq X < 0.5$, $Y_1Ba_2Cu_{3.5}O_{7+x}$ where $0 < x \leq 1$, $Y_1Ba_2Cu_4O_{8+x}$ where $0 \leq x \leq 1$, $Y_2Ba_1Cu_1O_5$, and $Y_1Ba_3Cu_2O_x$. The resistivities of these metallic phases are all less than about 0.05 ohm-cm at twenty degrees centigrade.

Since the resistivities of the conducting phases are typically much lower than the resistivities of the semiconducting phases of YBCO, the volume fraction of the YBCO layers of the invention that is conducting crystalline phase must be small enough so that the conducting crystalline phase does not form a conductive percolation path through the layer. This generally requires that the volume fraction of the YBCO layers that are conducting phases be less than 20 percent and more preferably less than 5 percent. Most preferably there is zero volume fraction of conducting phases in the YBCO layer of material. Conversely, the volume fraction of the YBCO layers that are semiconducting phase should be at least 80 percent, more preferably at least ninety five percent, and most preferably one hundred percent.

An important aspect of the present invention is that the YBCO layers may be deposited without heating the substrate and have the resistivity, dielectric constant, temperature coefficient of resistance, and change in dielectric constant versus temperature mentioned above. The substrate typically remains below 100 degrees centigrade during deposition when the substrate is not heated during deposition. The YBCO layers may be deposited by reactive coevaporation, sputtering, or pulsed laser deposition. In addition, chemical vapor deposition may also be used to form YBCO layers. YBCO films deposited at room temperature in this manner tend to be amorphous to polycrystalline on a fine scale.

While the temperature of the substrate may be heated during deposition in order to improve the crystallinity of the depositing layer of material, heating the substrate during deposition is not essential.

A post deposition annealing in controlled partial pressure of oxygen may also be used in order to control the oxygen composition of the YBCO layers. The post deposition anneal, in a low pressure of oxygen can deplete oxygen from the YBCO layers, resulting in semiconducting YBCO layers. However, annealing is not essential. Thus, the present invention provides for deposition of YBCO layers at temperatures that are compatible with conventional semiconductor processing. The YBCO layers are useful due to their high resistance and high temperature coefficient of resistance (for bolometer applications), high dielectric constant and temperature coefficient of dielectric constant (for pyroelectric detector applications), and ferroelectric property (for transistor applications).

An amorphous semiconducting thin film can also be used as the sensitive material for a bolometer. Typically, the semiconducting YBCO thin film can be fabricated into a thermal isolation structure to reduce the thermal conductivity between the substrate and the thin film sensitive element. The incident photon flux is chopped with a mechanical or electro-optical chopper. The ability to deposit semi-insulating/semiconducting thin films at ambient temperature by rf magnetron sputtering is particularly attractive. By avoiding the annealing step the amorphous structure is formed. The lack of an annealing procedure also is more compatible with CMOS technology.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 12b is a graph showing the temperature coefficient of resistance of the same YBCO samples in FIG. 12a.

DETAILED DESCRIPTION OF THE PREFERRED EMBODIMENTS

Figure 1:
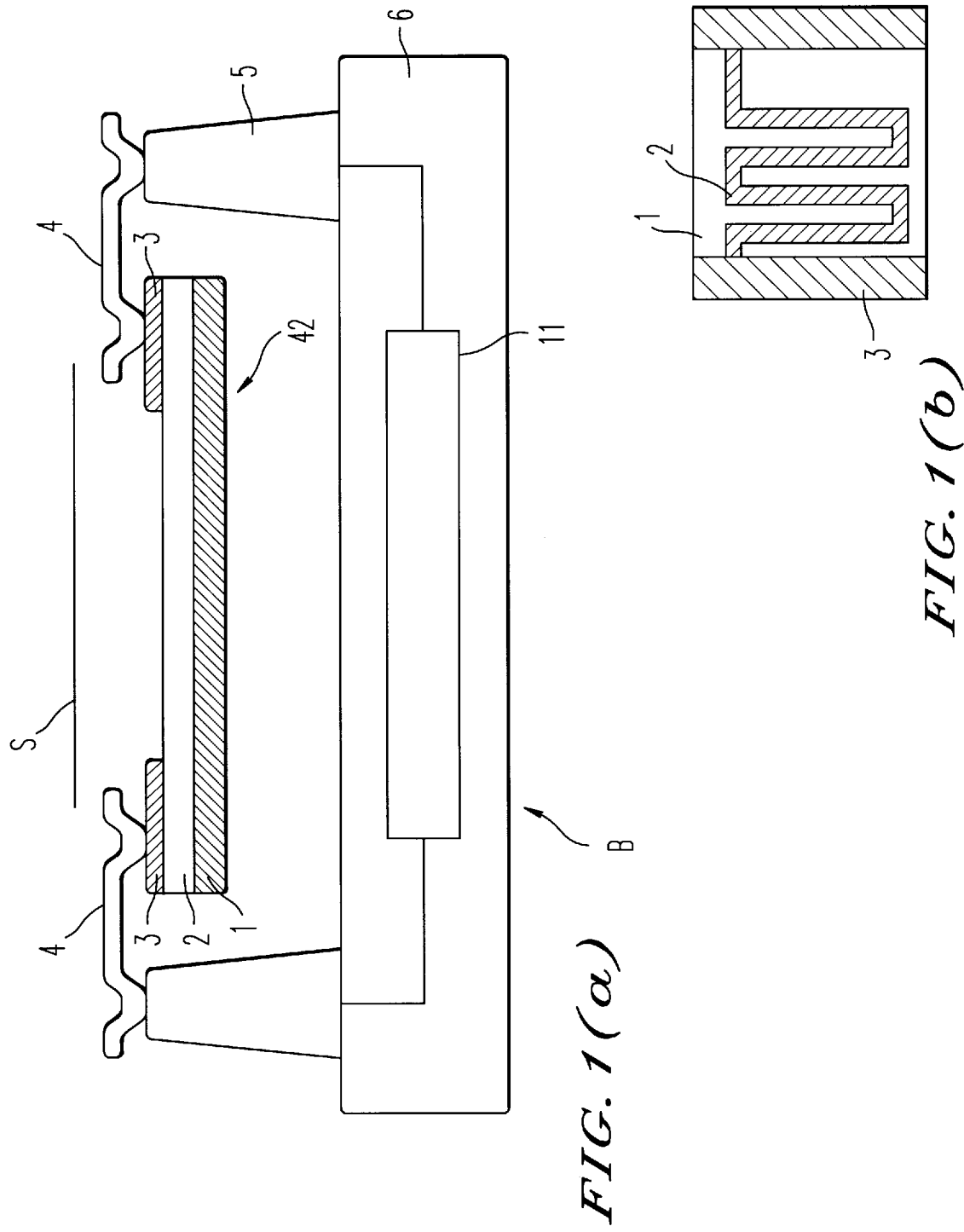
FIG. 1(a) is a side sectional view of a bolometer incorporating a layer of YBCO material according to the present invention.
FIG. 1(b) is a plan view of the integral detector structure in FIG. 1(a)

Referring now to the drawings, wherein like reference numerals designate identical or corresponding parts throughout the several views, and more particularly to FIG. 1 thereof, FIG. 1 shows a bolometer B having a supporting layer 1 on which is a crystalline or polycrystalline semiconducting YBCO layer 2 according to the invention. Two conducting electrodes 3, 3 are on the YBCO layer 2. The supporting layer 1, YBCO layer 2, and conducting electrodes 3, 3 form the integral transducer structure 42. Preferably, the integral transducer structure 42 is supported by the connector leads 4 which also electrically connect the conducting electrodes 3, 3 to the conducting pillars 5, 5. The height of the conducting pillars 5, 5 is greater than the combined thickness of the supporting layer 1, the YBCO layer 2, and the conducting electrodes 3 so that the integral transducer structure 42 is suspended above an upper surface of the substrate 6. The substrate 6 may be a semiconductor substrate which includes the integrated circuit 7. Alternatively, the substrate 6 may have the integrated circuit 7 mounted to it. The integrated circuit 7 is electrically connected to the YBCO layer 2 so that it can send electrical signals to the YBCO layer 2 and receive signals from the YBCO layer 2 via the conducting pillars 5. A shutter or chopper S is schematically indicated above the exposed surface of the YBCO layer 2 for alternately exposing the YBCO layer 2 to radiation and blocking the YBCO layer from radiation. The supporting layer 1 is an insulator.

The integral transducer structure 42 is spaced from the substrate 6 in order to provide increased thermal isolation to thereby provide the bolometer B with a high responsivity. Preferably, the thickness of the integral transducer structure 42 (i.e., the thickness of the supporting layer 1, the YBCO layer 2, and an electrode 3) is less than 10 microns and more preferably less than 5 microns in order to decrease the thermal mass and thereby increase the thermal response to incident radiation.

FIG. 1(b) is a plan view of the upper surface of the integral transducer structure 42 and shows the upper surface of the supporting layer 1, meander pattern formed by the YBCO layer 2, and the upper surface of the electrodes 3, 3. However, the meander pattern is not essential for the operation of the bolometer. The preferred pattern is a rectangular or square pattern.

The integrated circuit 7 is electrically coupled to the YBCO layer 2 via the conducting pillars 5 and comprises means for measuring the resistance of the YBCO layer 2. The means for measuring resistance comprises either a means for providing a voltage across the YBCO layer and a means for measuring the resulting current through the YBCO layer 2 or a means for providing a current through the YBCO layer 2 and a means for measuring the resulting voltage drop across the YBCO layer 2. The means for measuring resistance also includes means for dividing the voltage by the current.

It is not necessary for the integral transducer structure 42 to electrically connect to the substrate 6 via the conducting pillars 5. If the electrical connection between the integral transducer structure and the integrated circuit 7 does not include the conducting pillars 5, then the pillars need not be conducting. The pillars provide structure for thermally isolating the integral transducer structure from the substrate. Preferably, the pillars project up from the substrate by at least 100 nanometers.

It is not necessary for the means to measure the resistance of the YBCO layer 2 to be in the integrated circuit 7 or even on the substrate 6.

The supporting layer may be formed of, for example, silicon nitride, strontium titanate, or yttrium stabilized zirconia.

Figure 2:
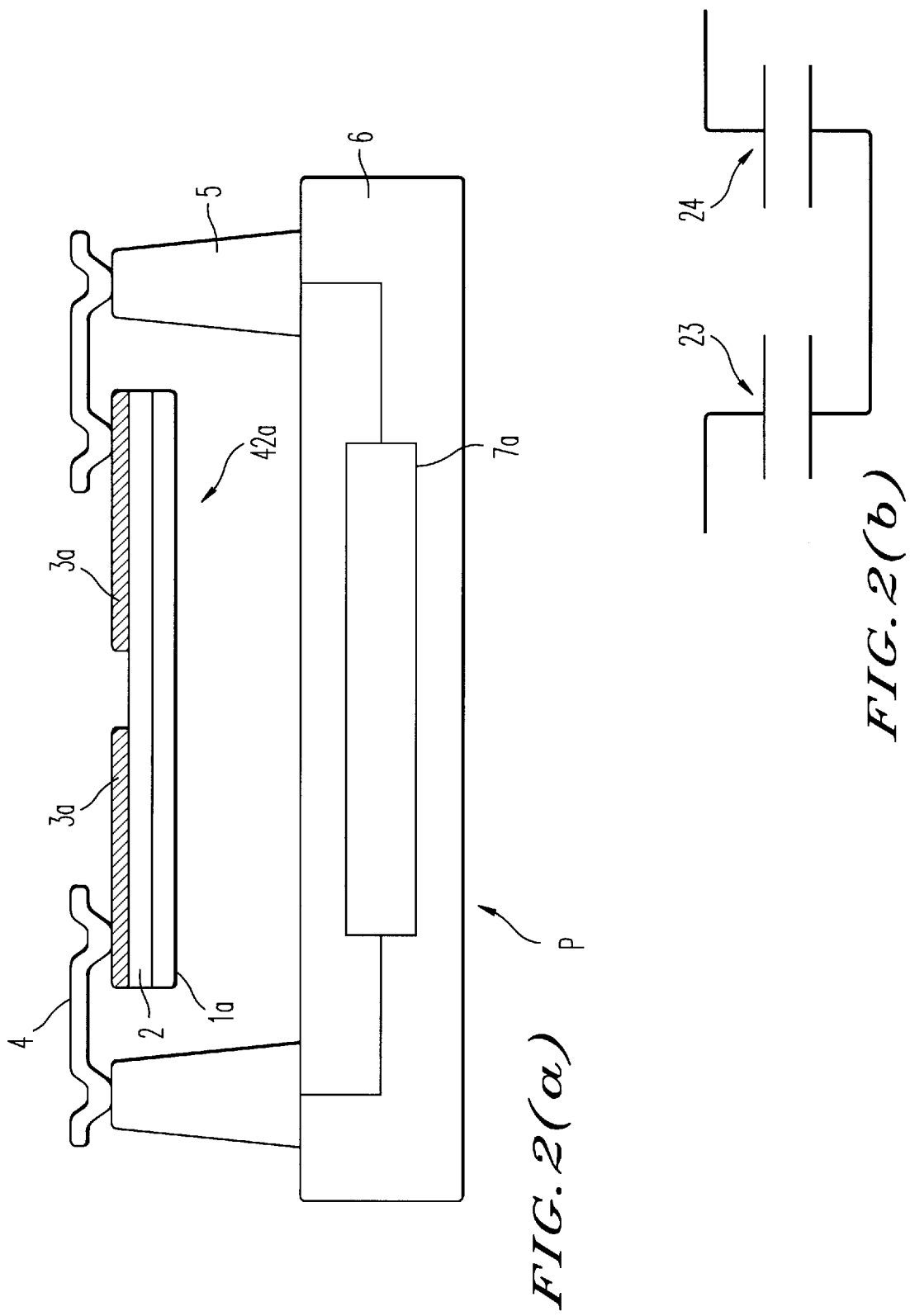
FIG. 2(a) is a side sectional view of a pyroelectric detector incorporating a layer of YBCO material according to the present invention.
FIG. 2(b) is a schematic of the equivalent circuit of the integral detector structure in FIG. 2(a)

The FIG. 2 is a cross-section of a pyroelectric detector P including the integral transducer structure 42a and the integrated circuit 7a. The integral transducer structure 42a includes the conducting supporting layer 1a upon which is deposited the YBCO layer 2. The electrodes 3a, 3a are on the YBCO layer 2. The electrodes 3a, 3a each form a capacitor with the conducting supporting layer 1a and have the YBCO layer 2 as a dielectric between them. The areas of the electrodes 3a, 3a can be different from one another so that the capacitance associated with each electrode 3a, 3a are not equal. While this embodiment shows two capacitors, only one capacitor is necessary for a pyroelectric detector.

FIG. 2(b) shows an equivalent circuit formed by the two electrodes 3a, 3a and the conducting supporting layer 1a which includes the capacitor 23 and the capacitor 24.

The integrated circuit 7a includes means for measuring the pyroelectric current generated by change in the electric polarization of the YBCO layer 2 in the integral transducer structure 42a. The means for measuring the pyroelectric current of the integral transducer structure 42a may include means for providing an alternating current or voltage (i.e., an alternating current source or an alternating voltage source) across the electrodes 3a, 3a and means for measuring the resulting alternating voltage or current (i.e., a voltmeter or ammeter) across the electrodes 3a, 3a. While two capacitors requiring the two electrodes 3a, 3a are shown in this embodiment, only one capacitor and one electrode are necessary for a pyroelectric detector, in which case the means for measuring pyroelectric current only provides an alternating current or voltage across one electrode 3a and measures voltage or current across the one electrode 3a. It is not necessary to apply a bias voltage to measure the pyroelectric current.

Preferably the integral transducer structure 42a is less than 10 microns thick and more preferably is less than 5 microns thick in order to provide low thermal mass. Most preferably, the integral transducer structure 42 is less than one micron thick.

A variation to the integral transducer structure 42a has one connector lead connected to the conducting supporting layer 1a instead of to a first one of the electrodes 3a. In this variation the first one of the electrodes 3a would not be necessary. Preferably, the change in the dielectric constant of the YBCO layer 2a with change in the temperature at twenty degrees centigrade is at least 0.2.

Figure 3:
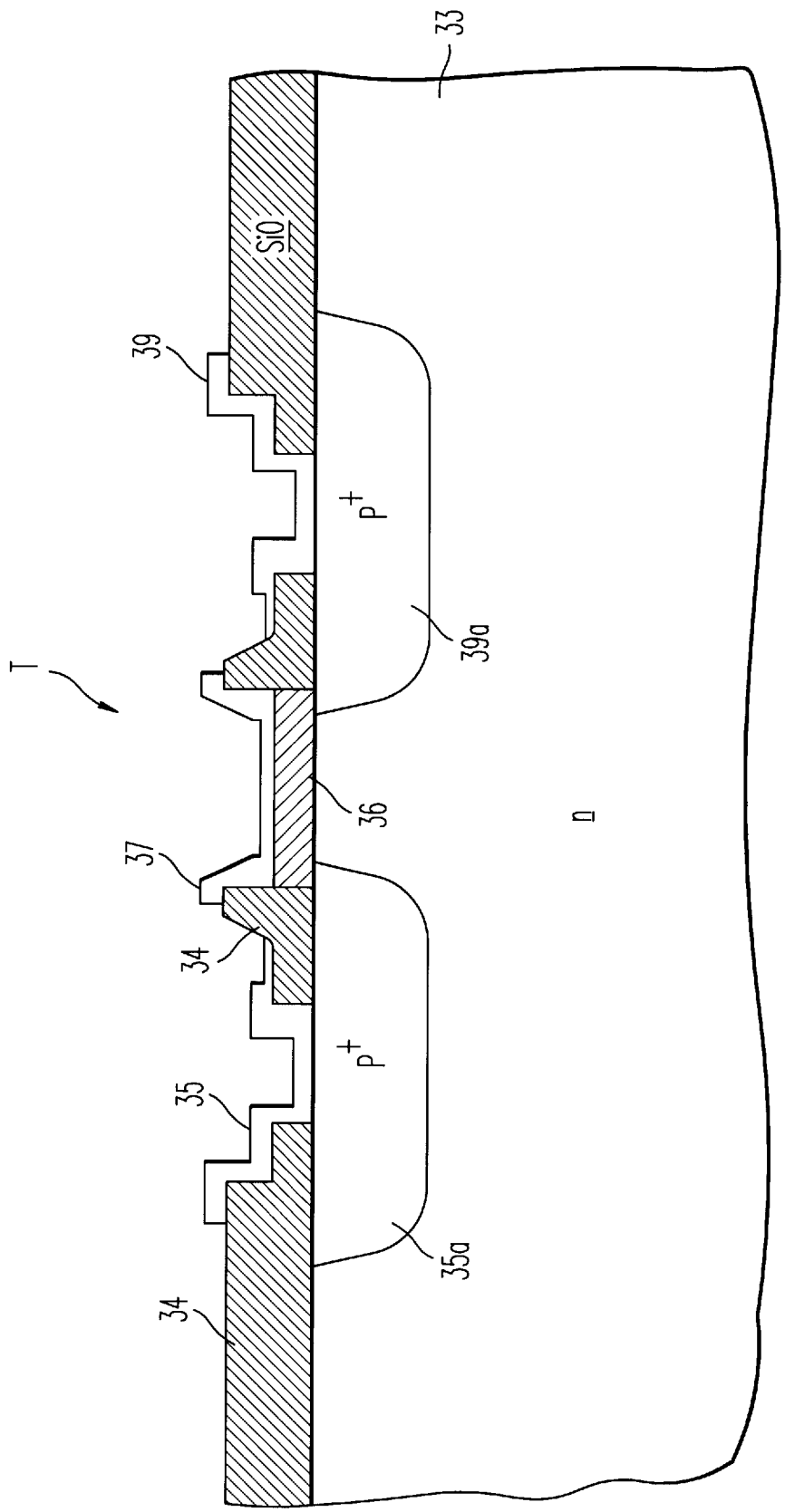
FIG. 3 is a side sectional view of a semiconductor transistor incorporating a layer of YBCO material in the gate insulator according to the present invention.
Figure 4A:
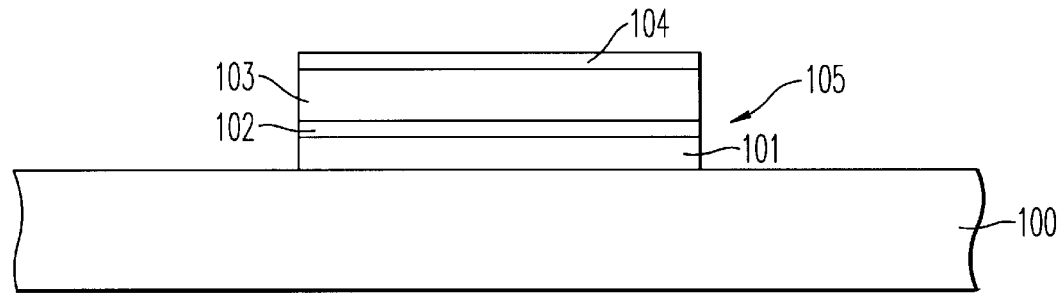
FIGS. 4(a) and 4(b) are partial side sectional views showing intermediate structures during a process for fabricating a suspended integral transducer structure.
Figure 4B:
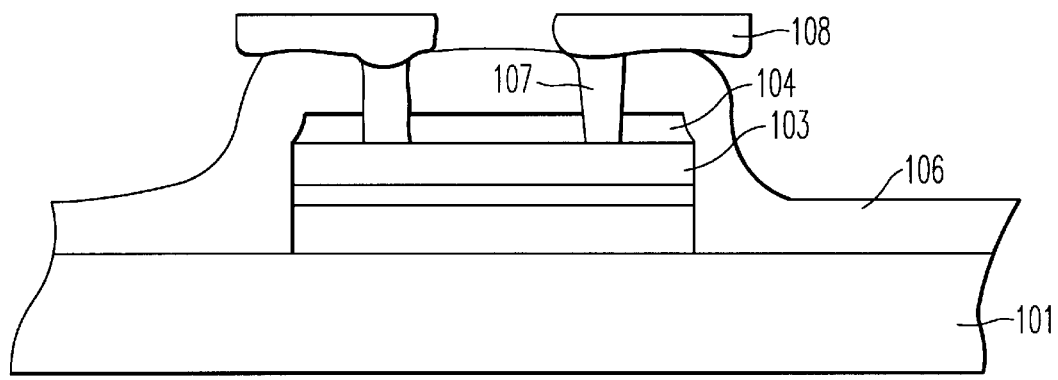
Figure 4C:
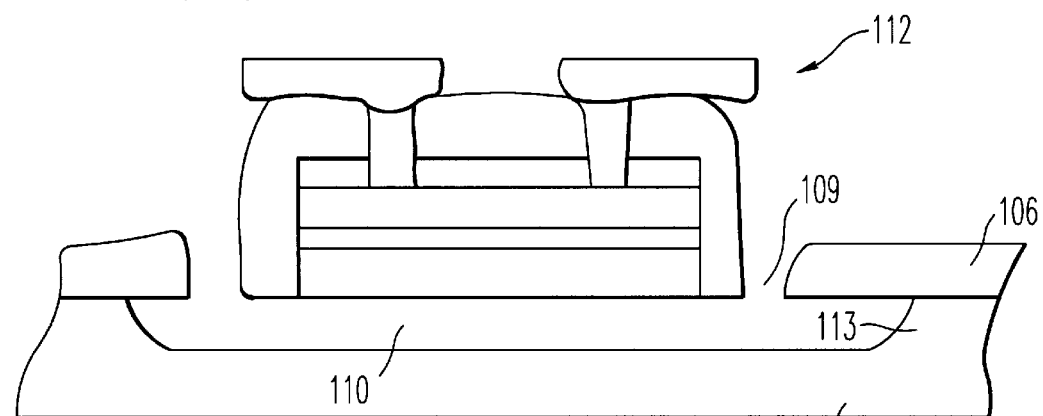
FIG. 4(c) is a partial side sectional view showing a suspended integral transducer structure.
Figure 4D:
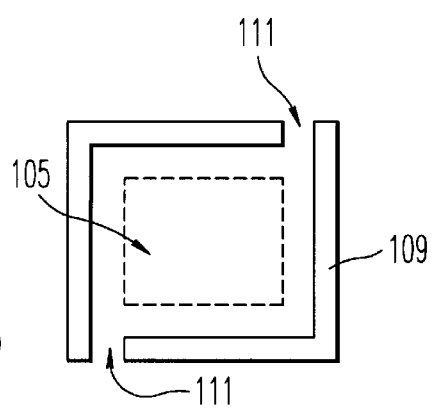
FIG. 4(d) is a partial plan view of the suspended integral detector structure of FIG. 4(c)
Figure 5A:
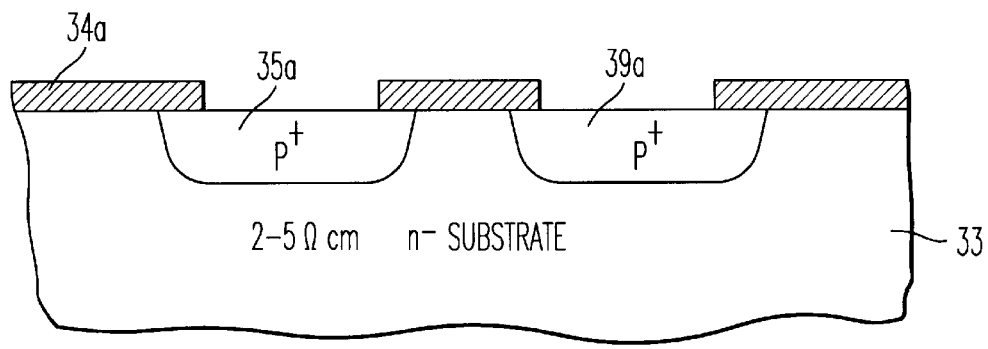
FIGS. 5(a) to 5(d) are side sectional views of intermediate structures which are sequentially formed during a process of fabricating the semiconductor transistor shown in FIG. 3.
Figure 5B:
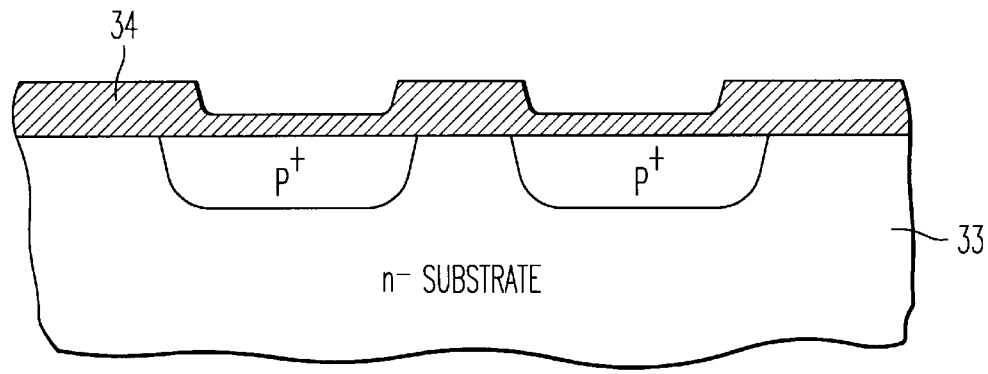
Figure 5C:
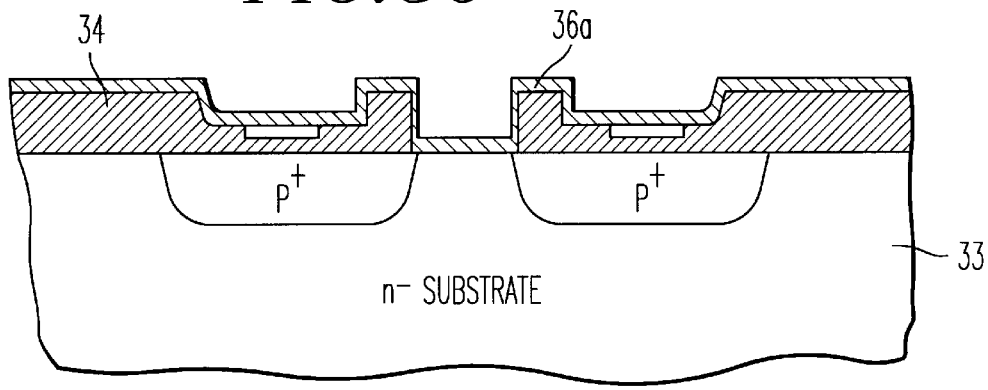
Figure 5D:
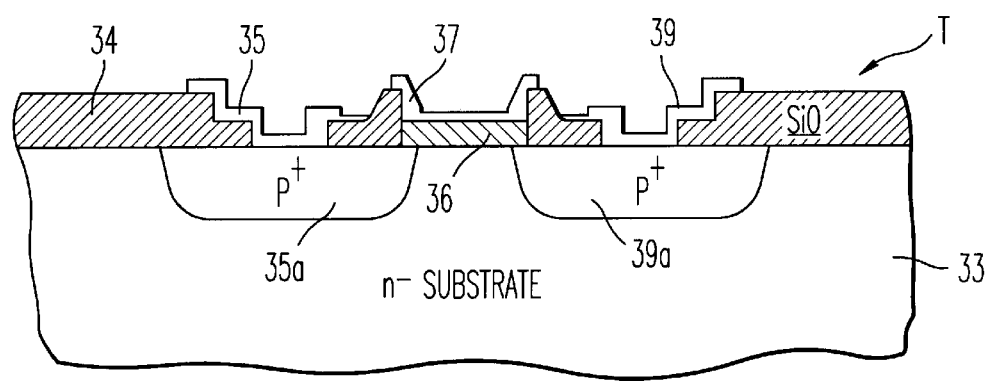

FIG. 3 is a cross-section showing a transistor 32 incorporating a YBCO layer 36 as the gate insulator and silicon dioxide as the field insulator layer 34, both of which are on the n type semiconductor substrate 33. Source electrode 35 and drain electrode 39 contact the p type source contact region 35a and the p type drain contact region 39a and are spaced apart from one another with the gate insulator YBCO layer 36 and the gate electrode 37 therebetween. The transistor channel 38 is the region in the substrate 33 that is beneath the gate electrode 37 and the gate insulator YBCO layer 36. The gate insulator YBCO layer 36 is ferroelectric and has an electric polarization whose direction may be aligned along a first direction by application of a first voltage pulse that is greater than a first value to the gate electrode, and whose direction may subsequently be reversed by application of a second voltage pulse of greater than a second value, but of opposite polarity to the first voltage, to the gate electrode. However, the ability to reverse the direction of polarization of the ferroelectric YBCO layer 36 is not necessary for the transistor T to be useful for increasing charge storage. When the transistor T forms the charge storage capacitor of a memory cell the stored charge is increased due to the presence of the ferroelectric YBCO layer 36.

The YBCO layer and integral transducer structures of the invention are compatible with conventional semiconductor processing techniques including the use of positive and negative photoresist and lift-off techniques. The integral transducer structures of the invention may be formed by conventional thin film processing techniques including the use of photoresist etch or lift-off processes.

A method for fabricating a suspended integral transducer structure is discussed with reference to FIG. 4(*a*) to FIG. 4(*d*). The integral transducer structure shown in FIG. 4(*c*) may be used as a bolometer according to the invention. While FIG. 4(*a*) to FIG. 4(*d*) illustrate formation of an integral transducer structure for a bolometer according to the invention, substantially the same fabrication process may be used to fabricate an integral transducer structure for a pyroelectric detector according to the invention. There are also alternative methods. The suspended membrane holding YBCO may be $Si_3N_4$, $SiO_2$, YSZ, $LaAlO_3$, $SrTio_3$ or others. MgO, YSZ, $LaAlO_3$ or $SrTiO_3$ can be used as buffer layers.

A first silicon nitride $Si_3N_4$ layer, a first yttrium stabilized zirconia layer, a YBCO layer, and a second yttrium stabilized zirconia layer are sequentially deposited onto the silicon substrate 100 and then patterned into the layered structure 105 which consists of the silicon nitride layer 101, the first yttrium stabilized zirconia layer 102, the YBCO layer 103, and the second yttrium stabilized zirconia layer 104, as shown in FIG. 4(*a*). The patterned silicon nitride layer 101, the first yttrium stabilized zirconia layer 102, the YBCO layer 103, and the second yttrium stabilized zirconia layer 104 may be etched or formed using ion milling.

Next, the second silicon nitride layer 106 is deposited onto the upper surface of intermediate structure shown in FIG. 4(*a*) and is patterned to expose a region of the second yttrium stabilized zirconia layer 104. The exposed regions of the second yttrium stabilized zirconia layer 104 are then etched to complete the contact cuts 107. The exposed regions of the second yttrium stabilized zirconia layer may be etched by ion milling. A metallic layer is then deposited on the upper surface and the metallic layer is then patterned to form the metal leads 108, as shown in FIG. 4(*b*).

After the metal leads 108 have been formed, the upper surface of the silicon nitride layer 106 is patterned and etched to form the trenches 109, which extend to the upper surface of the silicon substrate 101. Plasma etching may be used to etch the silicon nitride layer 106.

FIG. 4(*d*) shows the relative locations of the trenches 109 to the layered structure 105 of the integral transducer structure. The trenches substantially surround the layered structure 105, but leave support regions 111, 111 of the silicon nitride layer 106. The trenches are cut through the silicon nitride layer 106 to the upper surface of the silicon substrate 101. After the trenches 109 have been cut, the layered structure 105 is undercut by etching away part of the silicon substrate 100, starting from the exposed region of the silicon substrate 100 at the bottom of the trenches, to form the air gap 110. The regions of the silicon substrate beneath the support regions 111, 111 of the silicon nitride layer 106 are also etched away, which leaves the support regions 111, 111 supporting the integral transducer structure 112. The supports 111, 111 are part of the silicon nitride layer 106 and are in turn supported by the pillar regions 113 of the silicon substrate 100 that have not been etched away, and that include the original upper surface of the silicon substrate 100.

Only one support region is necessary. However, the embodiment of FIG. 4(*d*) shows the two support regions 111, 111 and more may be used. The selective etchant used to etch the silicon substrate does not etch silicon nitride. For example, potassium hydroxide may be used to etch the silicon substrate. The suspended integral transducer structure shown in FIG. 4(*c*) results after the air gap 110 is formed.

It is not necessary that the substrate on which the integral transducer structure is formed be silicon. For example, the substrate may be a III–V semiconductor or a polyamide.

FIGS. 5(*a*) to 5(*d*) illustrate in cross-section, various stages during one process for fabrication of the transistor T.

FIG. 5(*a*) shows the n type substrate 33 with the source contact 35a, the drain contact 39a, and a silicon dioxide field oxide layer 34a. The field oxide layer 34a is patterned to allow for the doping of the drain contact 39a and the source contact 35a. Next, the field oxide is regrown.

FIG. 5(*b*) shows the regrown field oxide layer 34 on the substrate 33. Next, the field oxide layer 34 is removed from the gate region and the YBCO layer 36a is deposited on the upper surface of the structure in order to provide the YBCO gate insulator.

FIG. 5(*c*) shows the YBCO layer 36a covering the upper surface of the structure. Next, the YBCO layer 36a that is outside the gate region is removed, contact cuts are opened for the source electrode 35 and the drain electrode 39, and a metallization layer is deposited and patterned into the source electrode 35, the drain electrode 39, and the metal wiring (not shown) for connecting to the transistor T of FIG. 5(*d*).

EXAMPLE 1

Bolometer

An integral bolometer transducer structure was formed by the following steps.

A 1000 Å thick magnesium oxide layer was formed on an n-type (100) silicon substrate by RF sputtering.

Next, a YBCO layer was then sputtered onto the magnesium oxide layer from a sputtering target of $Y_1Ba_2Cu_3O_7$ using 150 watts of power for 7 hours and in an atmosphere consisting of 10 millitorr of argon. The YBCO layer was about 500 nanometers thick. The substrate was not heated during the deposition of the YBCO layer.

Then, positive photoresist (Microposite 400-27 photoresist) was spun onto the YBCO layer at 3000 rpm and dried for 30 seconds. The photoresist was soft-baked at 90° C. for 30 minutes and then exposed to ultraviolet light for 6 seconds with a pattern designed to form an exposed region of YBCO before being emersed in developer (MF319 developer) in order to remove the photoresist from non-electrode regions. After development, the photoresist was hard-baked at 125° C. for 30 minutes.

The exposed YBCO was then removed by a wet etch using an aluminum etch for 1½ minutes. The remaining photoresist was removed from the YBCO layer and connecting leads were bonded to the YBCO layer.

Figure 6:
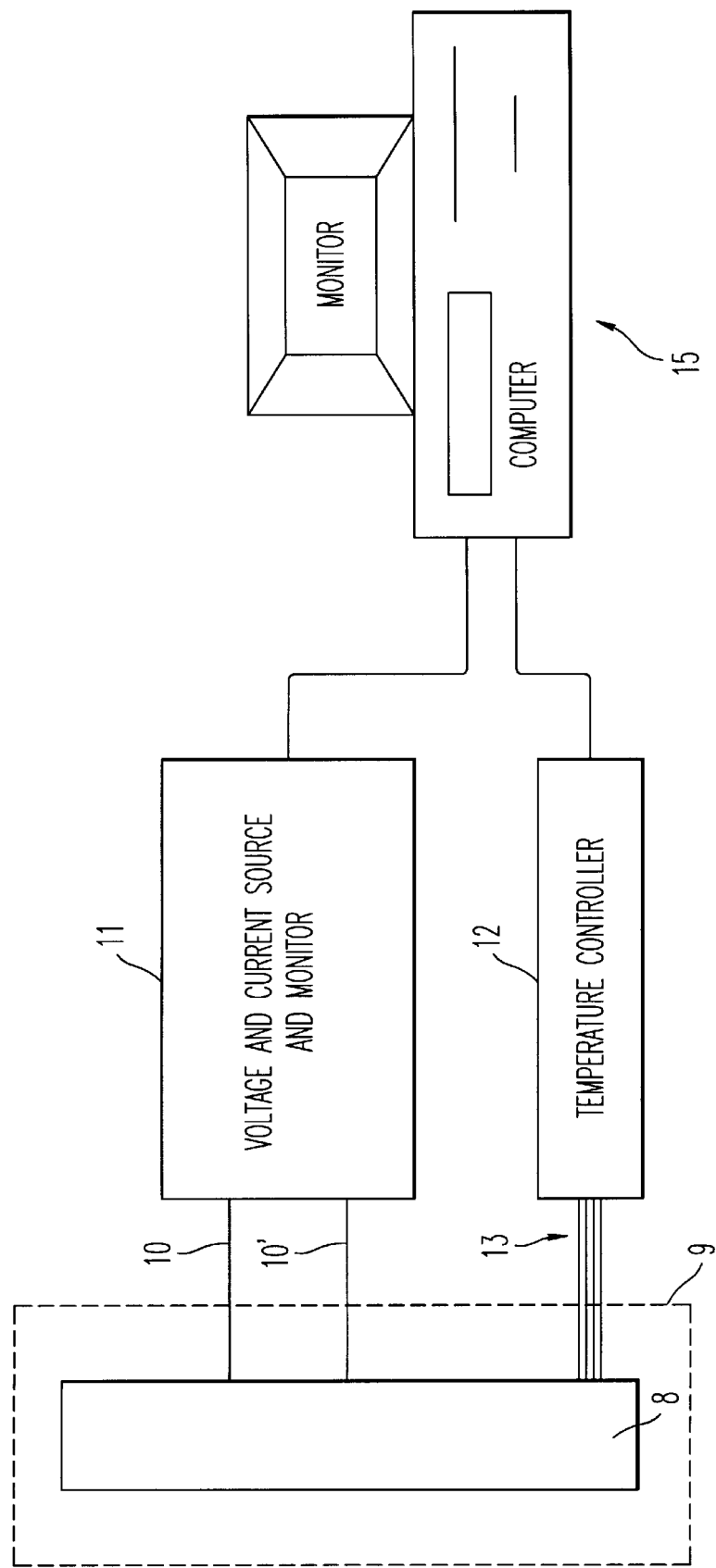
FIG. 6 is a block diagram of electronics for measuring resistivity versus temperature of a YBCO layer in a bolometer according to the present invention.

The resistance versus temperature of the YBCO layer of example 1 was measured using the system shown in FIG. 6. FIG. 6 shows a block diagram for measuring the resistance versus temperature of a semiconducting YBCO layer 8 in the cryostat 9, the DC leads 10, 10' connect the YBCO layer 8 to the DC current and voltage source and monitor 11. The temperature controller 12 is connected to the YBCO layer 8 via the leads 13 which are thermally sunk to the YBCO layer 8. The temperature controller 12 measures the temperature at the YBCO layer 8 via the leads 13 by a temperature sensor (not shown) and provides heat to the YBCO layer 8 by sending current via the leads 13 through a heater near the YBCO layer 8. The computer 15 is connected to the temperature controller 12 and the DC voltage and current source and monitor 11 and can thereby control the temperature of the YBCO layer 8 and receive the data from the DC voltage and current source and monitor 11 so that the computer 15 can display the resistance versus temperature of the YBCO layer 8.

The resistance of the YBCO layer of example 1 at about 20 degrees centigrade was $4 \times 10^6$ Ω. The width of the YBCO layer was 0.1 mm, the length of the YBCO layer was 11 mm, and the thickness of the YBCO layer was 500 nanometers. Therefore, the resistivity of the YBCO layer of example 1 was 1.8 Ω-cm.

Figure 7:
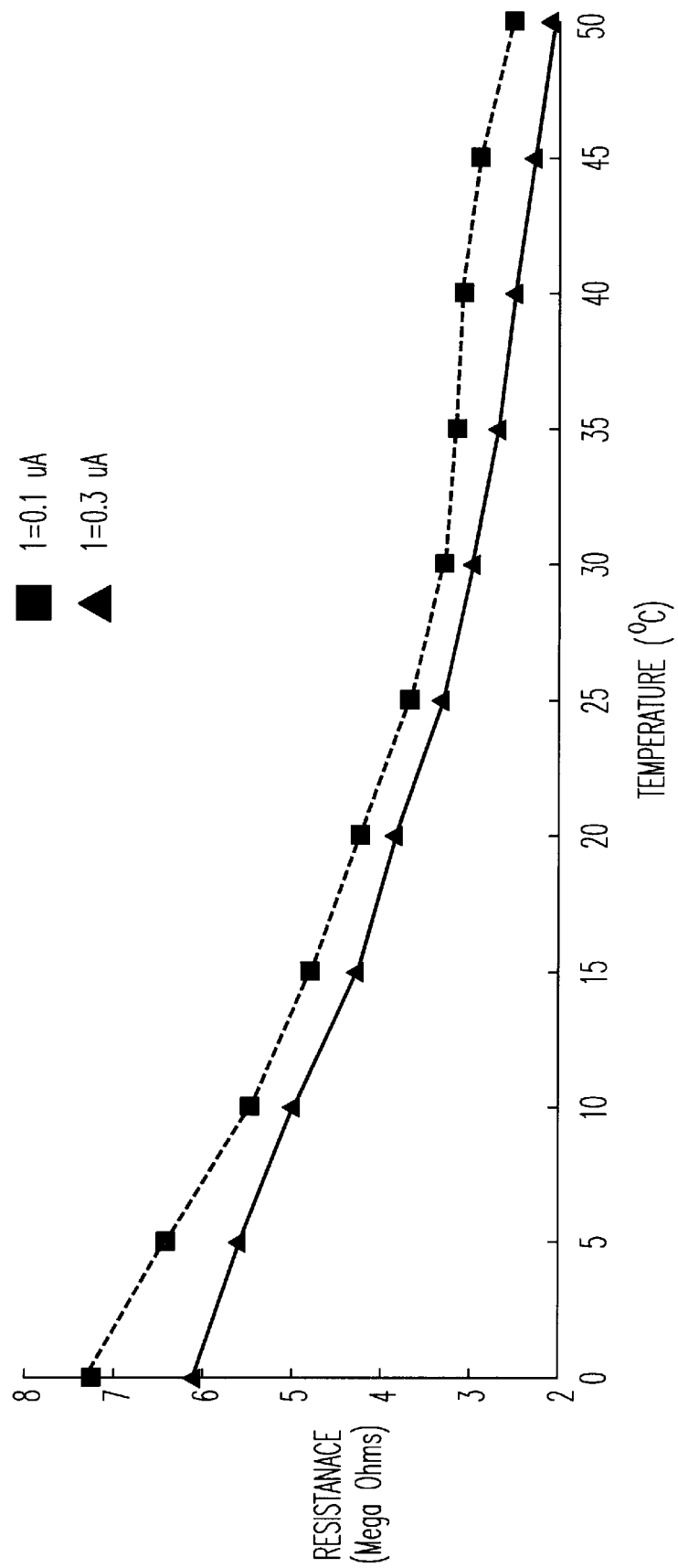
FIG. 7 is a graph showing resistance versus temperature for a layer of YBCO material according to the present invention.

FIG. 7 shows the temperature dependence of the resistance of the sample of example 1 versus temperature measured using two different bias currents. Using either of the two bias currents, the measured resistance falls rapidly from around $7 \times 10^6$ Ω at zero degrees centigrade to around $2 \times 10^6$ Ω at fifty degrees centigrade. The change in resistance per degree centigrade is about $0.1 \times 10^6$ Ω per degree centigrade. The resistivity of the sample was between 1.46 and 1.65 ohm-cm at about 20 degrees centigrade. The noise voltage was measure as $10^{-5}$ volts per root hertz at 30 hertz. The temperature coefficient of resistance of the YBCO layer was 3.5 percent per degree centigrade and the deduced detectivity was $10^9$.

The composition of the YBCO layer of the integral structure of example 1 was determined by electron probe analysis to be $YBa_{1.44}Cu_{1.65}O_{4.59}$ using a standard of YBCO on magnesium oxide. The primary phase indicated by X-ray diffraction was the tetragonal phase with stoichiometry of $YBa_2CU_3O_{6.5}$ with a peak at d=2.72 which corresponds to the (110) X-ray diffraction line for this tetragonal phase.

EXAMPLE 2

Pyroelectric Detector

An integral pyroelectric transducer structure was formed by the following steps.

A 3000 Å thick niobium bottom electrode was sputter deposited upon the upper surface of an n-type (100) silicon substrate.

Next, a 5000 Å thick YBCO layer was sputtered from a sputtering target of $Y_1Ba_2Cu_3O_7$ using 150 watts of power for 6 hours and in an atmosphere consisting of 10 millitorr of argon onto the niobium bottom electrode. The deposited layers were then annealed at 500 degrees centigrade for two hours in vacuum, in order to deplete the deposited layers of oxygen.

Then, a 3000 Å thick aluminum layer was deposited onto the YBCO layer by RF sputtering for 10 minutes in an atmosphere consisting of 15 millitorr of argon.

A photoresist layer of Micropositive 400-27 photoresist was spun onto the deposited layers at 3000 rpm and dried for 30 seconds. The deposited layers were then soft baked at 90 degrees centigrade for 30 minutes and subsequently exposed to UV light for 6 seconds. The exposed photoresist layer was developed in MF 319 developer for one minute to form photoresist circles of 0.9 mm diameter on the aluminum. Then, the deposited layers were hard-baked at 125 degrees centigrade for 30 minutes. The deposited layers were then emersed in a wet aluminum etch for 3 minutes in order to remove both the exposed aluminum and the exposed YBCO. This resulted in a cylindrical capacitor having a layer of YBCO according to the invention between a lower niobium electrode and an upper aluminum electrode.

Figure 8:
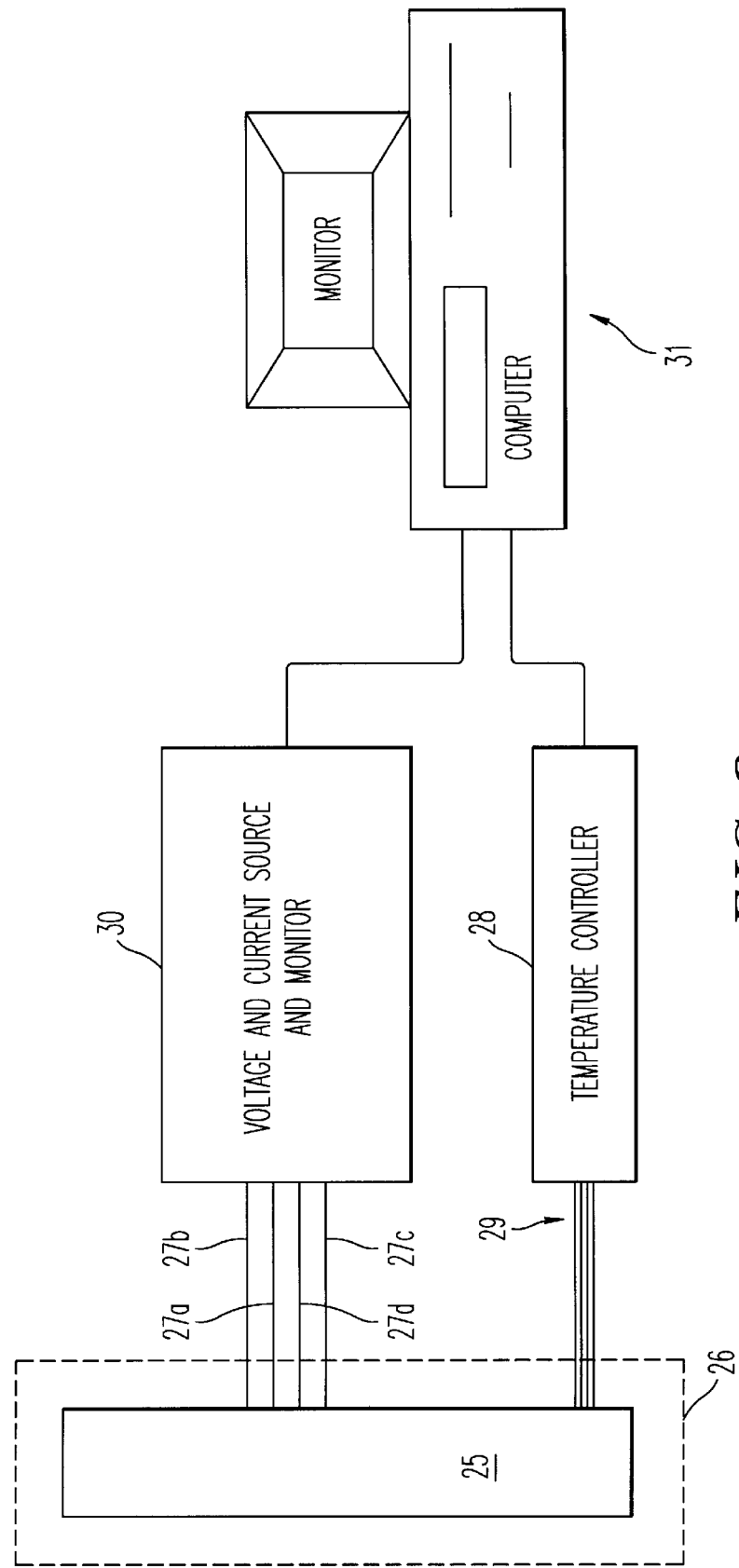
FIG. 8 is a block diagram of electronics for measuring capacitance versus temperature for a pyroelectric detector structure incorporating a layer of YBCO material according to the present invention.

The capacitance versus temperature of the capacitor of example 2 was measured using the system shown in FIG. 8. FIG. 8 shows a block diagram for measuring the capacitance versus temperature of a capacitor having the YBCO layer 25 as its dielectric. The capacitor with the YBCO layer 25 was disposed in the cryostat 26 and had current leads 27a, 27b, and voltage leads 27c, 27d connecting it to the LCR meter 30. Leads 27a and 27d were connected to the aluminum electrode and leads 27b and 27c were connected to the niobium electrode. The LCR meter 30 provided alternating current or voltage and measured alternating voltage or current. The temperature controller 28 was connected to the YBCO sample 25 via the leads 29. A sensor (not shown) was thermally sunk to the YBCO layer 25 and provided temperature data to the temperature controller 28. The temperature controller 28 provided electrical current to a resistive heater (not shown) that was thermally sunk to the YBCO layer 25 via the leads 29. The temperature provided by the temperature controller 28 was controlled by the computer 31 which received voltage and current data from the LCR meter 30 and computed and displayed capacitance of the YBCO layer 25 versus temperature.

Figure 9:
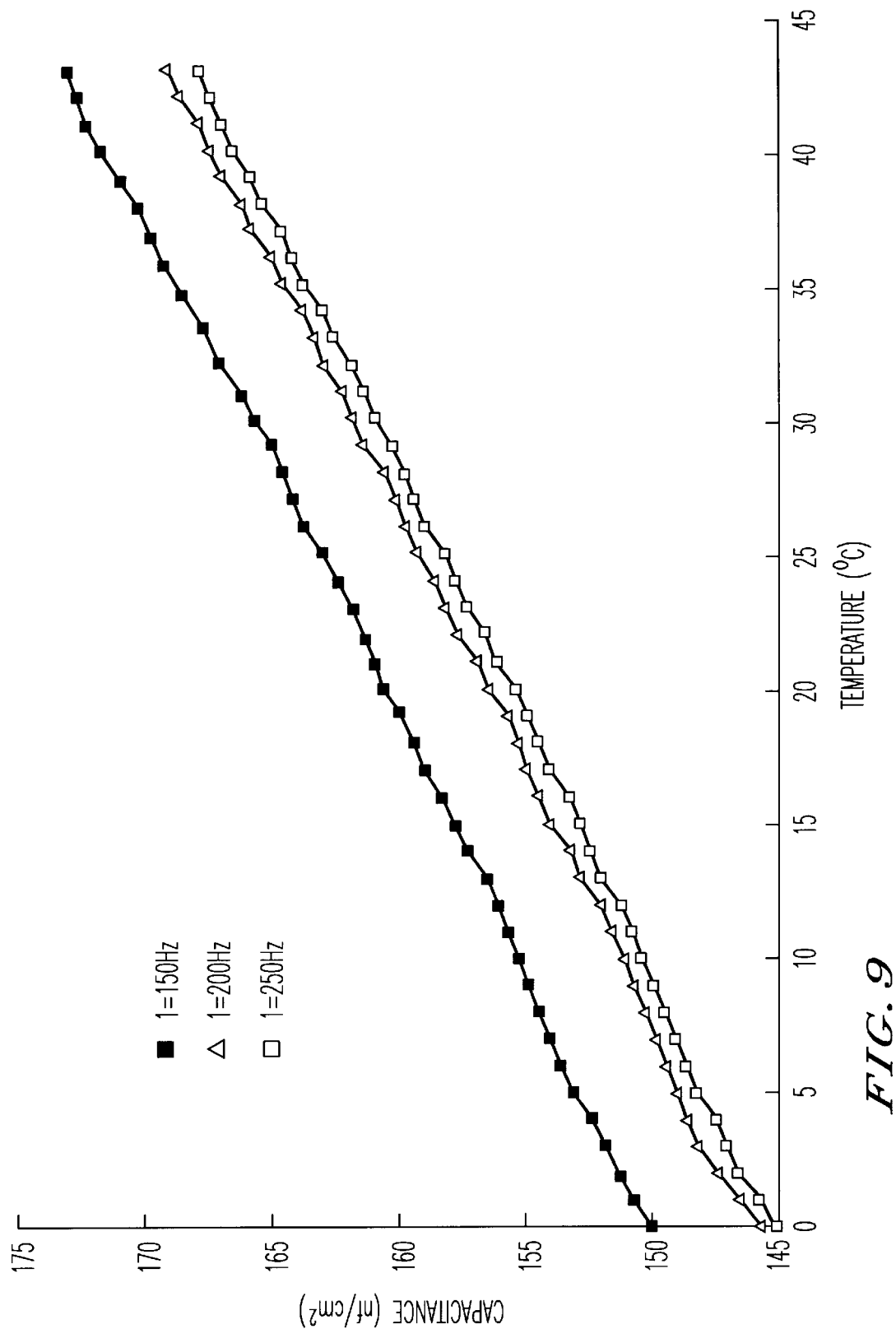
FIG. 9 is a graph showing capacitance per unit area versus temperature for a layer of YBCO material according to the present invention.

FIG. 9 shows the capacitance per area versus temperature for the capacitor of example 2 measured using the system shown in FIG. 8. The capacitance changes by approximately 20 nanofarads (nf) per square centimeter between 0 and 30 degree centigrade. This provides a change in capacitance per square centimeter of approximately 0.67 nf per square centimeter per degree centigrade. The three different curves in FIG. 9 correspond to measurements of capacitance versus temperature using the frequencies of 150 Hz, 200 Hz, and 250 Hz. However, for all three frequencies, the change in capacitance per change in temperature is substantially the same.

The composition of the YBCO layer of the capacitor of example 2 was determined by electron probe analysis to be $YBa_2Cu_3O_{6.45}$ using a standard of either YBCO on magnesium oxide or a standard of YBCO on lanthanum aluminate.

cannot be very accurately determined by the Rutherford backscattering technique and therefore may vary over a substantially wider range than indicated herein. Six samples are described in the following table:

| | | |
|---|---|---|
| a | YBaCuO(2000Å)—MgO(350Å)—Si | 1:0.54:2.01:4.51 Amorphous |
| b | YBaCuO(2000Å)—Si | 1:0.31:2.28:4.64 Amorphous |
| c | YBaCuO(2000Å)—SiO$_2$(8000Å)—Si | 1:0.37:2.43:4.57 Amorphous |
| d | YBaCuO(2000Å)—MgO(350Å)—SiO$_2$(8000Å)—Si | 1:0.48:2.37:4.79 Amorphous |
| e | YBaCuO(2000Å)—LaAlO$_3$ | 1:1.80:2.40:6.5 Tetragonal |
| f | YBaCuO(2000Å)—LaAlO$_3$ | 1:1.99:2.61:6.25 Tetragonal |

X-ray diffraction of the YBCO layer of the capacitor of example 2 indicates its structure to primarily be tetragonal having lattice constants a and b of 3.8 Å and a lattice constant c of 11.75 Å. The primary X-ray diffraction peaks appear at d=2.72 which corresponds to the (110) peak and at d=2.35 which corresponds to the (005) peak of the tetragonal YBCO phase having the composition of $YBa_2Cu_3O_{6.5}$. The measured dielectric constant of the YBCO layer at 200 hertz and about twenty degrees centigrade was 87 and the change in dielectric constant with temperature at about twenty degrees centigrade was 0.275 per degree centigrade.

EXAMPLE 3

Bolometer

A bolometer was prepared using substantially the same methods for the fabrication of the bolometer of example 1, but with the following differences.

Pulsed laser deposition was used to deposit the YBCO layer on a (100) oriented lanthanum aluminate substrate which resulted in a layer of YBCO that was oriented with its c axis perpendicular to the substrate. The YBCO layer was then annealed at 500 degrees centigrade in vacuum for 2 hours. The metals stoichiometry of the YBCO layer was determined by electron probe analysis to be $YBa_2Cu_3$. The resistivity of the YBCO layer was determined to be approximately 12.7 ohm-cm. The change in resistance at about 20 degrees centigrade was measured to be about 6000 ohms per degree centigrade. The noise voltage was measured as $10^{-6}$ volts per root hertz at 30 hertz. The temperature coefficient of resistance was calculated to be 2.31 percent and the deduced detectivity was $9 \times 10^9$.

EXAMPLE 4

Bolometer

Figure 10:
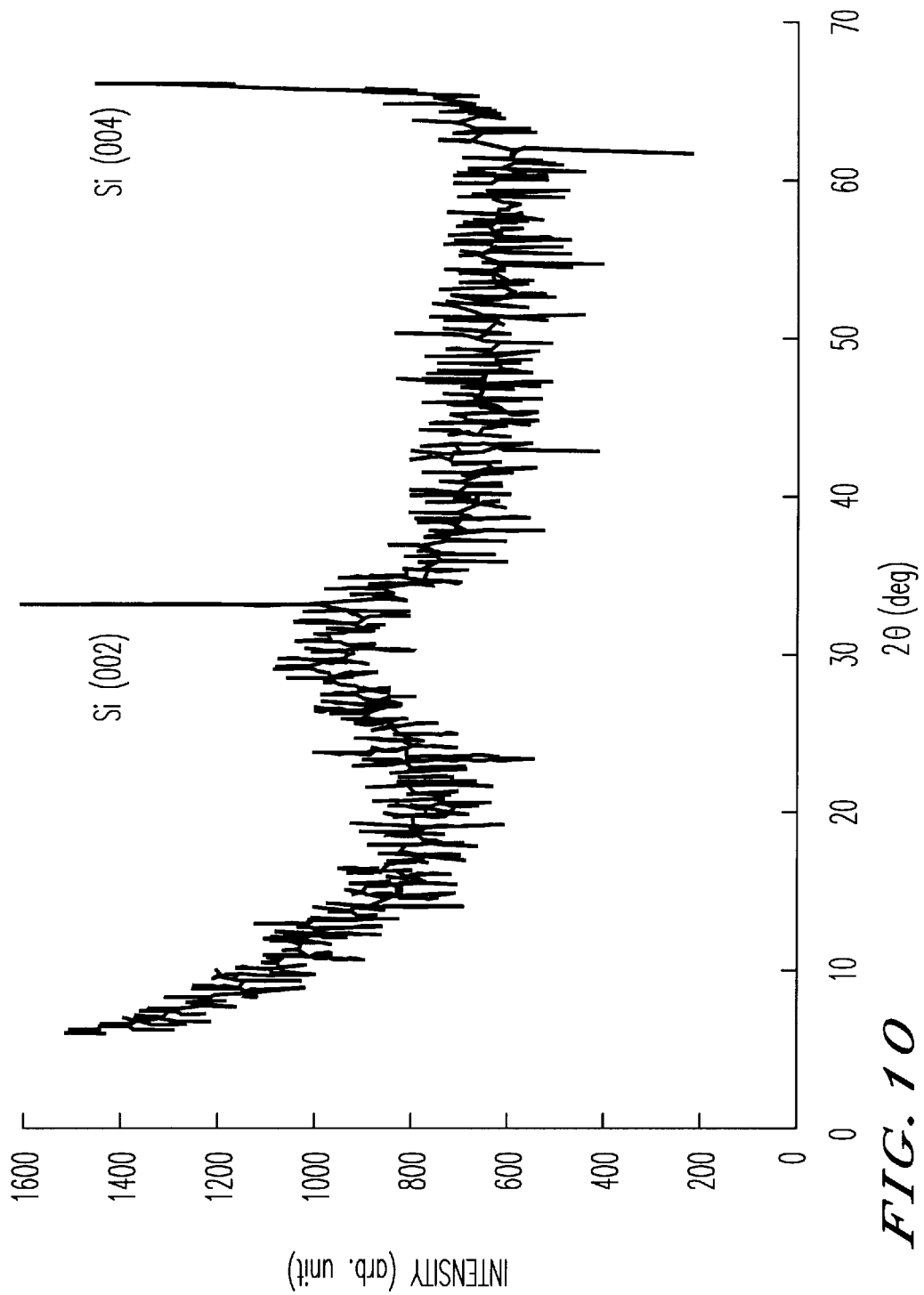
FIG. 10 is a graph showing the X-ray diffraction pattern of an amorphous thin film according to the present invention.
Figure 11:
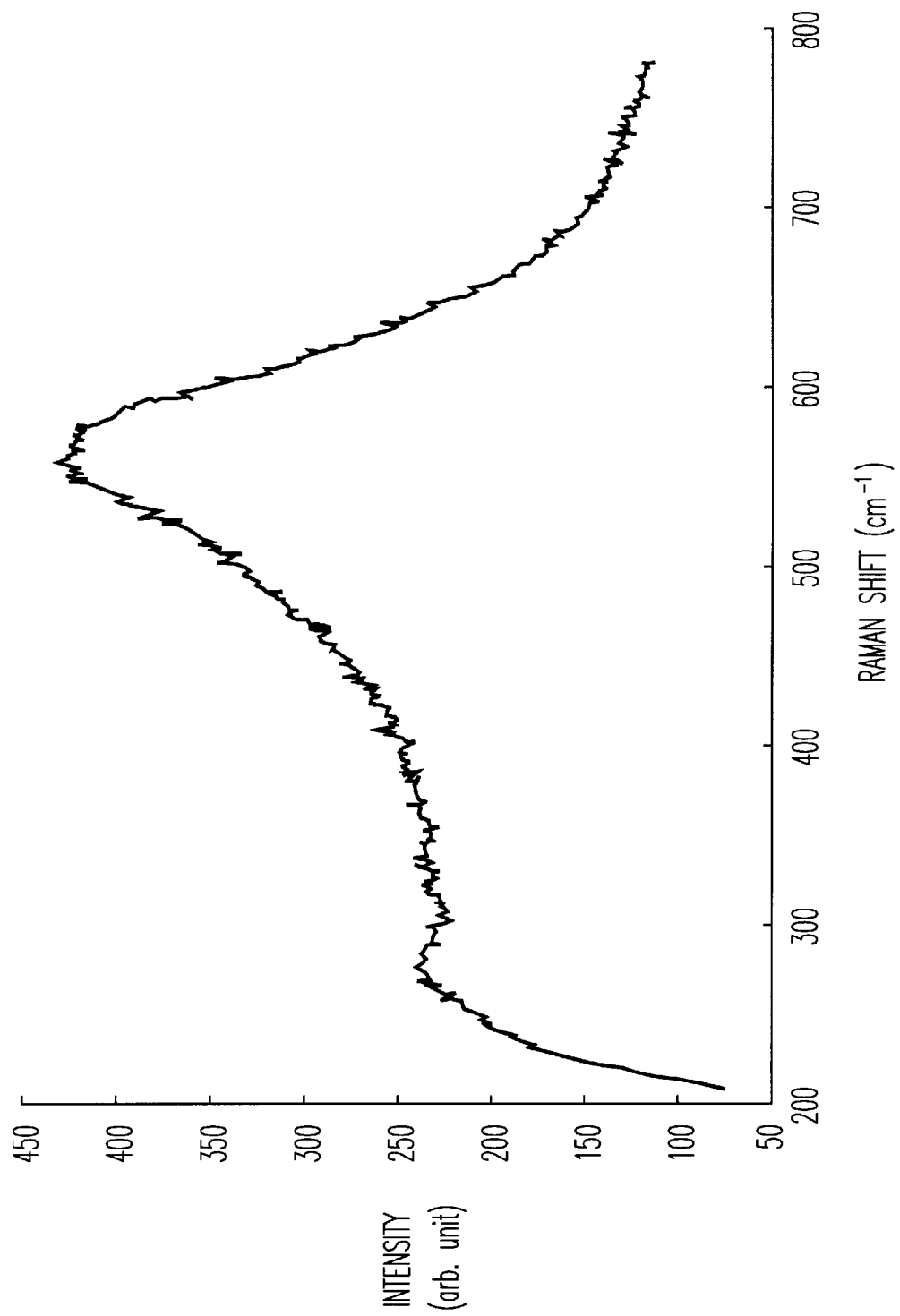
FIG. 11 is a graph showing the RAMAN scattering spectrum of an amorphous thin film according to the present invention.
Figure 12A:
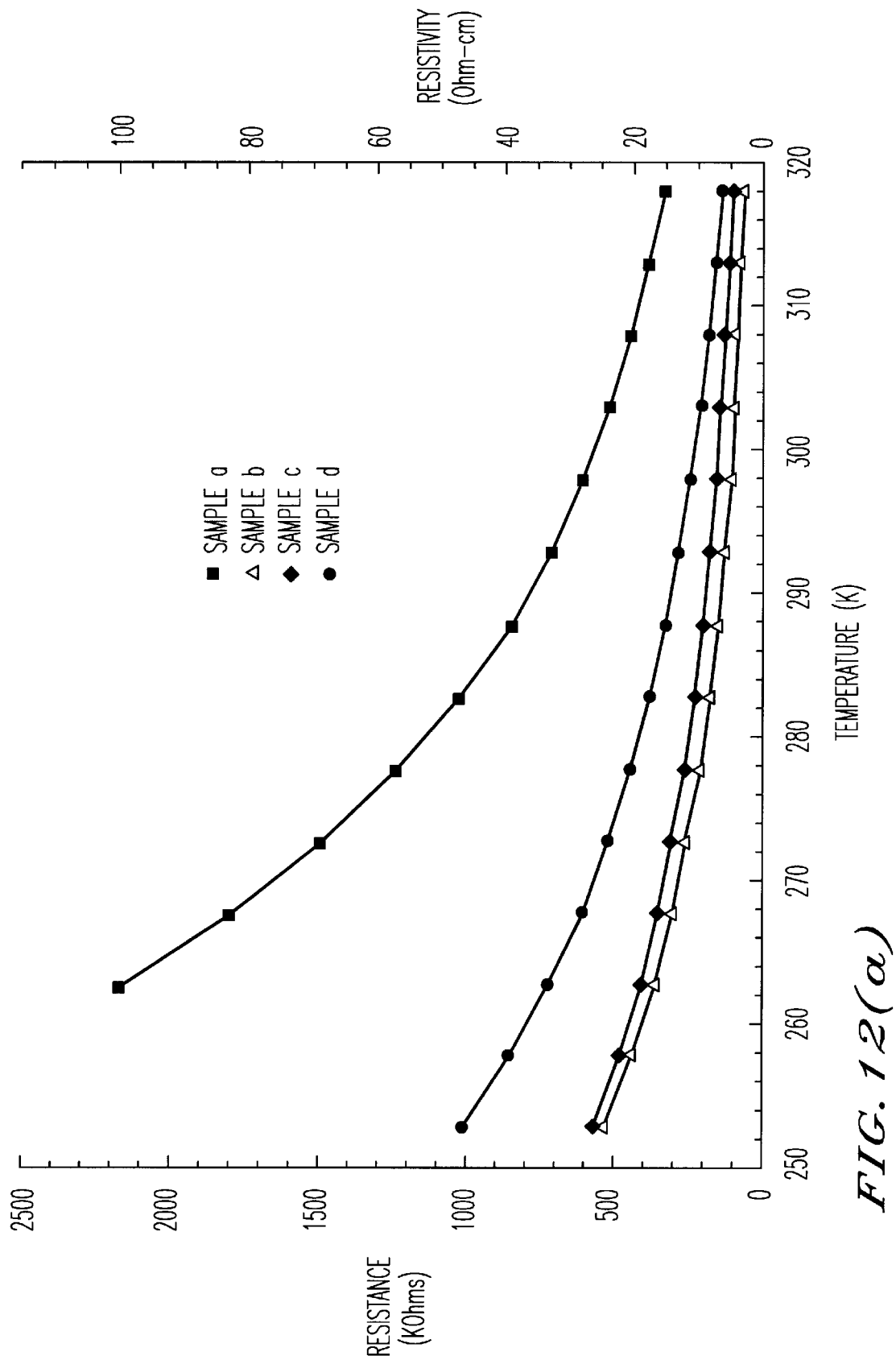
FIG. 12a is a graph showing resistance versus temperature for four different YBCO samples.
Figure 12B:
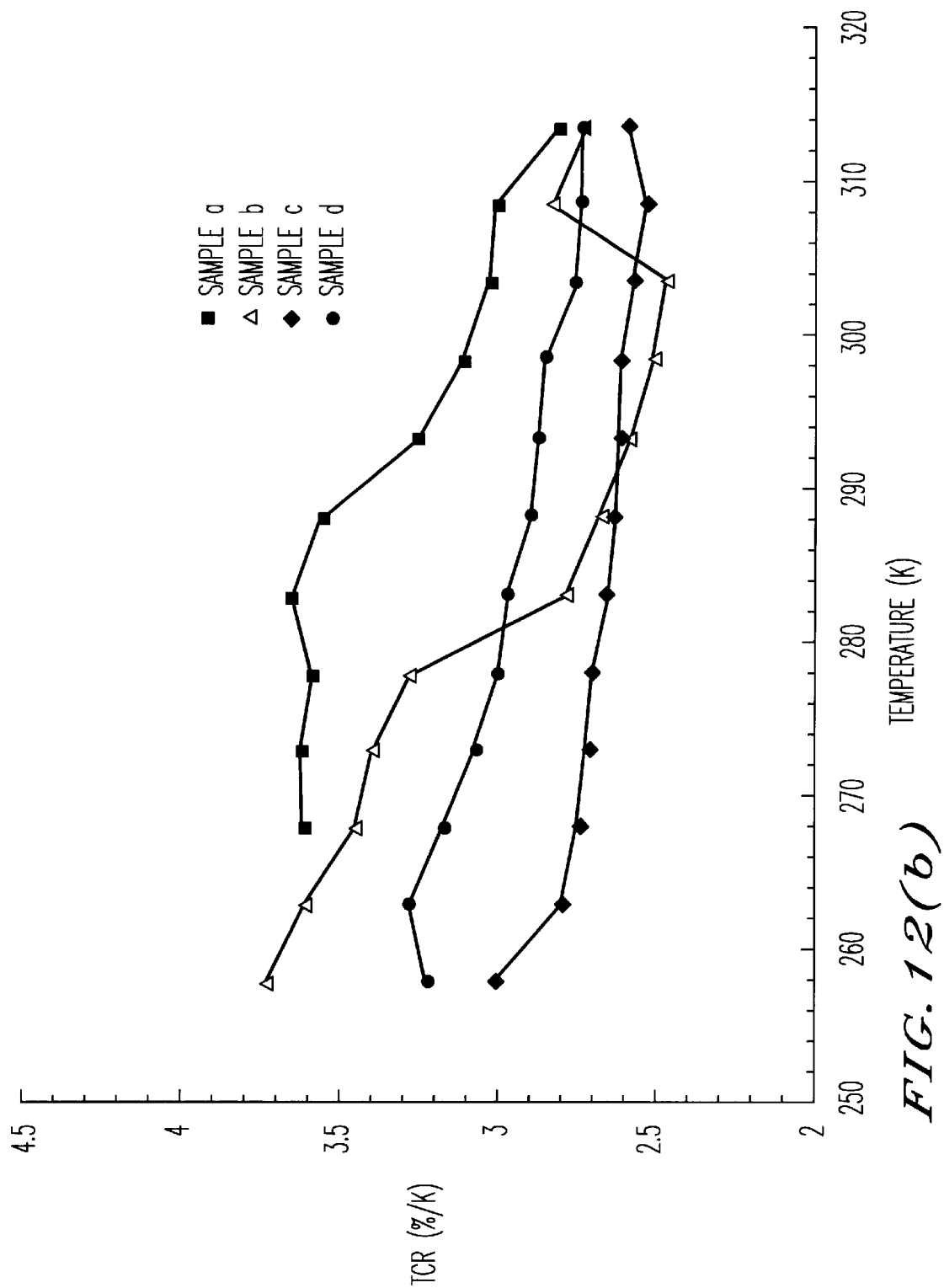

This example relates to amorphous YBCO films. YBCO films were deposited in the manner discussed above, except that the substrate was not heated during the deposition and that there is no post-deposition annealing. These films display semiconducting behavior, have an amorphous microstructure, and exhibit high detectivities and responsivities. The amorphous structure occurs because the annealing procedure which had resulted in recrystallization of the polycrystalline YBCO films discussed above, was omitted. Fabrication of detectors without the requirement of annealing is desirable because it provides for increased compatibility with other thin film technologies, such as CMOS. The composition of the YBCO amorphous thin films was determined by Rutherford backscattering as being between the ratios for the elements Y:Ba:Cu:O as 1:1.29:2.91:7.05 to 1:2.10:3.44:9.82, as measured by Rutherford backscattering spectroscopy. The preferred stoichiometry is $Y_1 Ba_{(0.3 \text{ to } 2.5)}Cu_{(2.0 \text{ to } 3.5)}O_x$ and has an amorphous microstructure. Preferably, x is between 4.00 and 9.82. However, x The amorphous films were determined to be amorphous by X-ray diffraction (FIG. 10) using the two Theta and glancing incident angle techniques. However, Raman spectroscopy (FIG. 11) showed a broad peak at 571 inverse centimeters. The temperature coefficient of resistance for the amorphous films was determined to be about 3.5–4% per degree centigrade at 20° C., indicating good bolometric response. The resistivity of the amorphous films (FIG. 12a) was determined to be greater than about 0.1 $\Omega$-cm at 20° C. The TCR is shown in FIG. 12b. Thus, these amorphous films can replace the previously discussed crystalline films and the disclosed bolometric structures.

Amorphous thin film materials have a number of advantageous technical features. It is capable of long wavelength infrared detection. It may operate at room temperature without temperature stabilization requirements. It can be deposited on micromachine air-gap bridge structures for high thermal isolation. It can be fabricated at low temperatures and therefore has good compatibility with existing CMOS technology. It utilizes a mechanical chopper for radiation modulation.

Amorphous thin film thermal detectors can involve bolometric or pyroelectric applications. The ease of fabrication and the performance obtained can exceed even those obtained in examples 1–3 above.

Figure 13A:
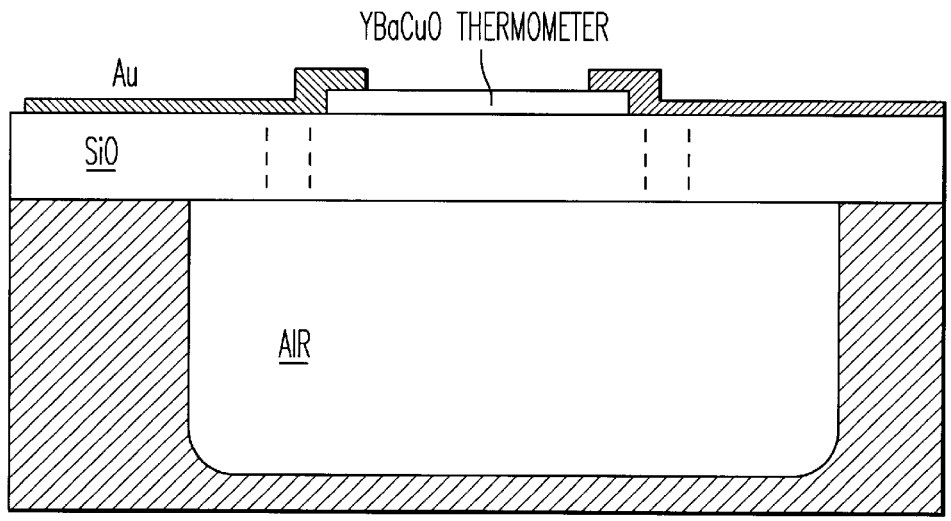
FIG. 13 shows a thermal isolation structure by removing supporting silicon from beneath according to the present invention.
Figure 13B:
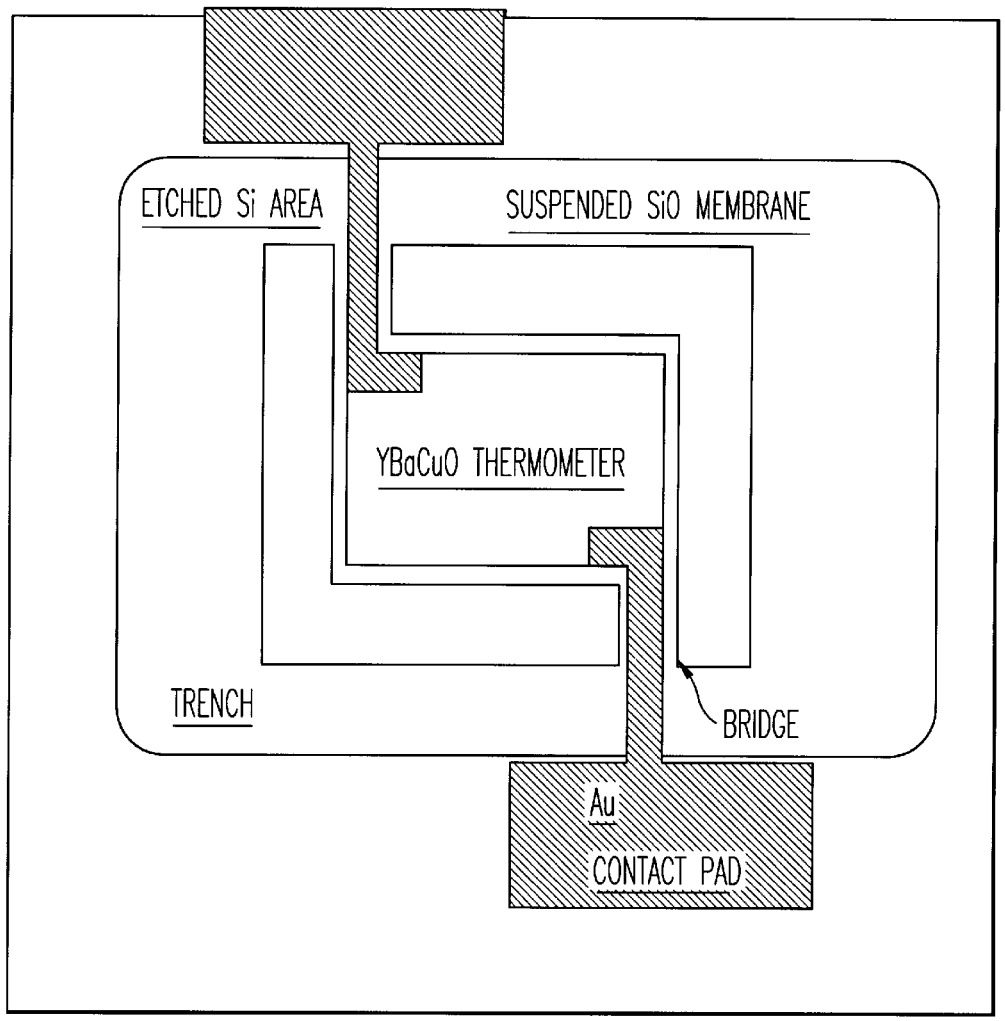

In order to achieve thermal isolation of the thin film element, it is integrated into a thermal isolation structure produced by Si micromachining technology. Thermal isolation structures can be produced by either building the thermal isolation structure on top of the Si substrate by using a sacrificial layer such as shown in FIG. 2 or by floating a thin film membrane by removing the supporting Si from underneath, such as shown in FIG. 13. In either case the YBCO sensitive element can be deposited onto a supporting thin film membrane which can be suspended from the substrate by Si micromachining technology. The supporting membrane is typically $SiO_2$ or $Si_3N_4$.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A bolometer, comprising:
an electrically insulating supporting layer having a supporting layer lower surface and a supporting layer upper surface;
a semiconducting transducing layer of amorphous oxide formed from (1) at least one member selected from the group consisting of barium, strontium, and calcium, (2) at least one member selected from the group consisting of yttrium, lanthanum, and rare earths, (3) copper, and (4) oxygen, having a transducing layer lower surface, a transducing layer upper surface for absorbing infrared radiation, a resistivity of greater than 0.1 Ω-cm at twenty degrees centigrade, a percentage change in resistivity with change in temperature of about 3.5 percent per degree centigrade at twenty degrees centigrade, and said transducing layer lower surface formed on and in contact with said supporting layer upper surface;

a first electrode layer having a first electrode layer lower surface and a first electrode layer upper surface, the first electrode layer lower surface in contact with a first region of the transducing layer upper surface; and a second electrode layer having a second electrode layer lower surface and a second electrode layer upper surface, the second electrode layer lower surface in contact with a second region of the transducing layer upper surface, wherein said supporting layer, said transducing layer, said first electrode layer, and said second electrode layer form an integral transducer structure;

means, electrically coupled to said first electrode layer and said second electrode layer, for measuring resistance of said transducing layer between said first electrode layer and said second electrode layer.

2. The bolometer according to claim 1, wherein:

a thickness of said integral transducer structure between said supporting layer lower surface and said first electrode layer upper surface is equal to or less than ten microns.

3. The bolometer according to claim 1, further comprising:

a substrate having a substrate lower surface and a substrate upper surface;

means for suspending said integral transducer structure above said substrate upper surface to provide thermal isolation of said integral transducer structure from said substrate; and wherein said means for suspending said integral transducer structure suspends said integral transducer structure so that said supporting layer lower surface opposes said substrate upper surface, said supporting layer lower surface is not in contact with said substrate upper surface, and said supporting layer lower surface is spaced from said substrate upper surface by an air gap.

4. The bolometer according to claim 1, further comprising:

a substrate having a substrate lower surface and a substrate upper surface;

means for suspending said integral transducer structure above said substrate upper surface to provide thermal isolation of said integral transducer structure from said substrate;

wherein said means for suspending said integral transducer structure suspends said integral transducer structure so that said supporting layer lower surface opposes said substrate upper surface, said supporting layer lower surface is not in contact with said substrate upper surface, and said supporting layer lower surface is spaced from said substrate upper surface by an air gap; and wherein said means for suspending said integral transducer comprises a pillar having a pillar upper surface, said pillar projecting up from said substrate upper surface so that said pillar upper surface is above said substrate upper surface.

5. The bolometer according to claim 1, further comprising chopper means positioned opposing said transducing layer upper surface for alternately blocking said transducing layer upper surface from said infrared radiation.

6. The bolometer according to claim 1, wherein said transducing layer forms a meander pattern.

7. The bolometer according to claim 1, wherein said transducing layer forms a rectangular pattern.

8. The bolometer according to claim 1, wherein said transducing layer forms a square pattern.

9. A bolometer comprising:

a silicon substrate;

a depression formed in the surface of said substrate by etching;

an insulating layer extending over the surface of said substrate and over said depressed area so as to be floating thereon;

a semiconducting transducing layer of amorphous oxide formed from (1) at least one member selected from the group consisting of barium, strontium, and calcium, (2) at least one member selected from the group consisting of yttrium, lanthanum, and rare earths, (3) copper, and (4) oxygen;

electrode means connected to said transducing layer; and means for measuring resistance of said transducing layer and being connected to said electrode means.

10. A sensing element for an infrared detector, comprising:

a semiconducting transducing layer of amorphous oxide;

said amorphous oxide being formed from (1) at least one member selected from the group consisting of barium, strontium, and calcium, (2) at least one member selected from the group consisting of yttrium, lanthanum, and rare earths, (3) copper, and (4) oxygen, having a transducing layer lower surface, a transducing layer upper surface for absorbing infrared radiation, a resistivity of greater than 0.1 Ω-cm at twenty degrees centigrade, a percentage change in resistivity with change in temperature of about 3.5 percent per degree centigrade at twenty degrees centigrade.

* * * * *